United States Patent [19]
McMonagle et al.

[11] Patent Number: 5,808,296
[45] Date of Patent: Sep. 15, 1998

[54] PROGRAMMABLE DETECTION SENSOR WITH MEANS TO AUTOMATICALLY ADJUST SENSOR OPERATING CHARACTERISTICS TO OPTIMIZE PERFORMANCE FOR BOTH HIGH GAIN AND LOW CONTRAST APPLICATIONS

[75] Inventors: Thomas R. McMonagle, Plymouth; Robert D. Stokes, East Bethel, both of Minn.

[73] Assignee: Banner Engineering Corporation, Minneapolis, Minn.

[21] Appl. No.: 620,371

[22] Filed: Mar. 22, 1996

[51] Int. Cl.⁶ .................................................. G01V 9/04
[52] U.S. Cl. ........................ 250/221; 250/559.4; 340/555
[58] Field of Search ............................... 250/222.1, 221, 250/223 R, 223 B, 559.4, 559.38, 559.39, 559.32; 340/555–557; 356/373, 375; 359/152, 154, 155, 169, 170

[56] References Cited

U.S. PATENT DOCUMENTS

| | | | |
|---|---|---|---|
| 4,356,393 | 10/1982 | Fayfield | 250/214 R |
| 4,965,548 | 10/1990 | Fayfield | 340/511 |
| 5,212,391 | 5/1993 | Wachli | 250/559.4 |
| 5,225,689 | 7/1993 | Buckle et al. | 250/559.4 |
| 5,281,810 | 1/1994 | Fooks et al. | 250/222.1 |

*Primary Examiner*—Que Le
*Attorney, Agent, or Firm*—Merchant, Gould, Smith, Edell, Welter & Schmidt, P.A.

[57] ABSTRACT

A detection sensor with a single switch for multi-function programming of the sensor is disclosed. The sensor has a processor operatively connected to the switch, an emitter, and a detector for controlling one or more operational parameters of the sensor in response to a program signal from the switch. In the preferred embodiment the processor compares a signal detected by the sensor in a first state and a second state and automatically establishes the sensor amplifier gain and switching thresholds based on the signal difference in the two states.

10 Claims, 14 Drawing Sheets

PROGRAMMABLE DETECTION SENSOR WITH MEANS TO AUTOMATICALLY ADJUST SENSOR OPERATING CHARACTERISTICS TO OPTIMIZE PERFORMANCE FOR BOTH HIGH GAIN AND LOW CONTRAST APPLICATIONS

BACKGROUND OF THE INVENTION

1. Field of the Invention

The present invention relates to an object detection sensor. Such sensors are commonly used in industrial and commercial applications to detect the presence, absence or condition of an object. In particular, the present invention relates to a detection sensor operating under photoelectric principles although other types of sensors, such as ultrasonic, are contemplated within its scope. More specifically, the present invention relates to an object detection sensor that may be easily and quickly programmed by the user to establish desired and optimum operational modes and parameters of the sensor.

2. Background of the Prior Art

Object detection sensors, and particularly those based upon photoelectric principles, are well known in the prior art. Such sensors are widely used in industry for a variety of measurement and control functions. An example of such use is the detection of an object on a conveyor belt. The photoelectric sensor generates a modulated light beam that is periodically interrupted by the object to be detected. The sensor has a light receiving means which receives the light that is returned to the sensor. The light returned to the sensor is a measure of the presence or absence of the target object. The sensor has circuitry which provides an electronic signal representing the light returned to the photosensor. In a typical application when the object interrupts the light beam this may be referred to as the "target" state of the photosensor. When the light beam is uninterrupted the photosensor may be referred to as being in the "background" state. In other applications the two states may correspond to two targets each having a different reflectivity. There is a difference in the amplitude of the electronic signal generated by the photosensor in the target state as compared with the background state. This difference may be referred to as the "contrast". The photosensor also includes electronic circuitry for producing an output signal that may be used as a control signal. For example, the photosensor may be used to detect containers on a conveyor belt with the output signal of the photosensor being used to control the application of a label to the containers. An example of a prior art photoelectric sensor as described is shown in U.S. Pat. No. 4,356,393 which is assigned to the assignee of the present invention.

The output of the photosensor switches when the detected light changes from the target state to the background state and vice versa. The signal level at which the output switches is referred to as the signal threshold. Generally, this threshold signal level is preset by the photosensor manufacturer.

Prior art detection sensors have been provided with means to adjust the operational mode of the sensor as well as means to adjust certain operational parameters of the sensor. Among the characteristics that are adjustable in the prior art photosensors is the gain of the amplifier that amplifies or boosts the electronic signal that is generated as a result of the light that is returned to and received by the sensor. In addition the timing of the output signal of the sensor may be adjusted as well as output operation. Adjustment of the sensor operating modes and operational characteristics is required so that the user can establish proper signal amplification and output operations. Generally in the prior art the sensors have been provided with a plurality of switches that are manually operable to set the various operational modes and characteristics of the sensor.

More recently detection sensors have been available that have microcontrollers that are capable of automatically varying the amplifier gain, measuring the value of the electronic signal in both the target and background states at each gain level, comparing the differences in the signal at each gain level, and setting the amplifier gain for the particular application. An example of one such sensor is disclosed in U.S. Pat. No. 5,281,810. This type of sensor is particularly useful when the signal differentiation between the target and background conditions is relatively small. These types of applications are called low contrast applications which require careful amplifier gain adjustment so that the amplifier does not saturate. This also enables the contrast or difference between the two conditions to be maximized. In this new generation of sensor there is typically a manual override so that the operator can adjust the gain to a setting that maximizes the excess gain performance of the sensor when the user determines that the conditions require or will allow a maximum gain setting. This new generation of sensor also typically has multiple switch means to set the various operating parameters and operating modes of the sensor.

There has been continuing effort to reduce the size of detection sensors in order to minimize the space required for installation of the sensors. As the sensor becomes smaller the space available for switches and adjustment mechanisms is reduced. Thus a system that enables multiple function programming of the sensor with minimal switch means would be advantageous. In addition it would also be advantageous to have a sensor that would not only automatically establish the optimum amplifier gain to maximize low contrast performance but also to automatically set the sensor gain to maximize excess gain performance where the application allows or requires it.

Prior art sensors also incorporate light emitting diode (LED) bar graph displays to provide a visual indication of contrast as well as diagnostic information about sensor operation. An example is disclosed in U.S. Pat. No. 4,965,548 which is also assigned to the assignee of the present invention. It would be advantageous to use the prior art LED display to provide feedback to the operator during programming of the sensor.

SUMMARY OF THE INVENTION

The present invention is a detection sensor with an emitting means for generating a detection signal intended to be blocked by or reflected from an object and detecting means for generating an electronic signal that represents the presence, absence or condition of the object based upon the detection signal returned to the sensor. A single switch means provides multi-function programming of the sensor and generates a programming signal that is input to a processing means. The processing means is operatively connected to the emitting means, detecting means, and switch means for controlling one or more operational characteristics of the sensor in response to the program signal. The single switch means may be a single manually operable push button. The electronic signal generating means further has a variable gain amplifier and the electronic signal has a first amplitude representing a first state of the sensor and a second amplitude representing a second state of the sensor.

These two states correspond to what may be referred to as the target state and the background state, respectively. The processing means compares the amplitude of the electronic signal in the two states and provides a signal to adjust the gain of the variable gain amplifier to an optimum gain setting. The processing means selects the gain setting to either maximize the low contrast gain or maximize the high excess gain performance of the sensor. The processing means also establishes the sensor signal threshold and hysteresis values based on the comparison of the electronic signal in the two states.

A preferred embodiment of the present invention is a photoelectric detection sensor with a light emitting means to provide modulated light signals that are intended to reflect from, or be blocked by, a target object. The sensor has a photodetector to receive the returned modulated light and electronic circuit means to generate a signal representing the returned light. The electronic circuit means has at least one adjustable gain amplifier. The processing means is a microcontroller with an analog to digital converter for converting the electronic signal from analog to digital form. A single push button genrates a programming signal to the microcontroller. The sensor is provided with a light emitting diode (LED) display that provides information including programming prompts to the operator as well as information concerning the operational modes and parameters of the sensor, diagnostic information concerning the sensor, and the amplitude of the signal representing the light returned to the photosensor.

The present invention thus provides a multi-functional detection sensor programmable by a single switch means. The sensor of the present invention also automatically adjusts the sensor gain to an optimum to either maximize the low contrast performance of the sensor or maximize its excess gain performance and also automatically adjusts the sensor switching thresholds to optimize sensor performance. These and other advantages of the present invention will become apparent with reference to the accompanying drawings, detailed description of the preferred embodiment, and claims.

DETAILED DESCRIPTION OF THE PREFERRED EMBODIMENT

Figure 1:
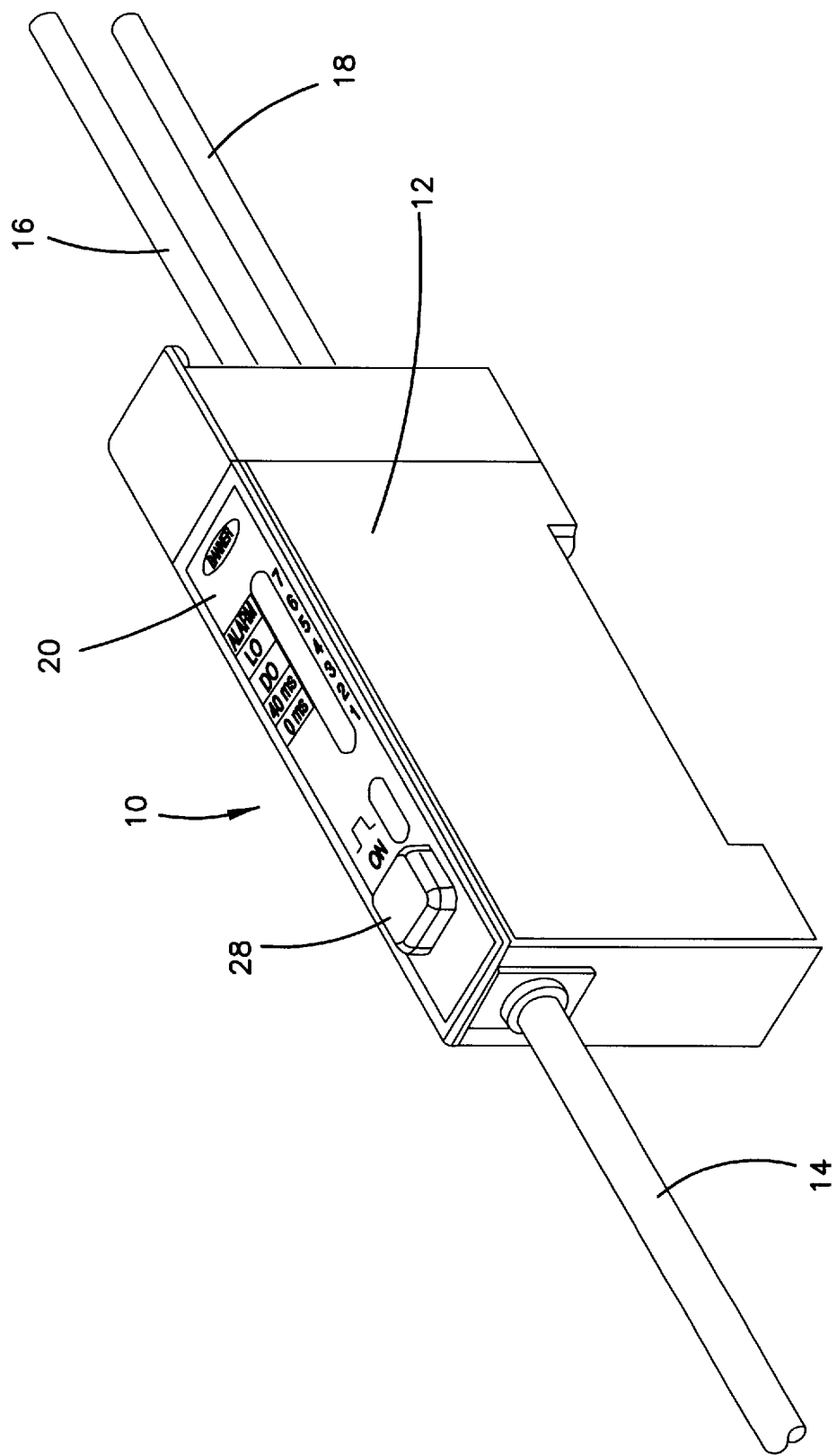
FIG. 1 is a view in perspective of a sensor incorporating the present invention.

Referring to the drawings wherein like numerals represent like components throughout the several views, a sensor according to the present invention is illustrated generally in FIG. 1 at 10. In the preferred embodiment disclosed and described herein sensor 10 is a photoelectric sensor. In other words the photosensor generates a modulated light beam which is intended to be reflected by or blocked by a target object. The intensity of the light beam that is returned to the photosensor is representative of the presence, absence or condition of the target object. It should be understood that an object detection sensor operating on principles other than photoelectric is also within the scope of the present invention. For example, an ultrasonic detection sensor is within the scope of the present invention. Sensor 10 has a housing 12 in which the components of the sensor are mounted. An electrical conduit 14 carries wiring to and from the sensor to provide power to the sensor as well as signals to and from the sensor as is well-known in the prior art. A pair of fiber optic cables 16 and 18 function as conduits for the modulated light emitted from the sensor and returned to the sensor, respectively. Sensor 10 has a faceplate 20 which is shown in more detail in FIG. 2. Faceplate 20 has indicia representing the modes of operation of sensor 10: LO (light operate), DO (dark operate), 40 ms (40 millisecond output delay), 0 ms (zero output delay). Faceplate 20 also has a label ALM (alarm). Each of the legends of the indicia are aligned with one of a plurality of light emitting diodes on a light emitting diode (LED) display 22. There are seven light emitting diodes on LED display 22. The indicia aligned with the bar graph display in conjunction with the light emitting diodes provide information to the user concerning the operational mode of the sensor and an alarm condition as will be described in more detail hereafter. A light emitting diode 24 provides an indication of whether or not the sensor is powered on. A light emitting diode 26 indicates the state of the output of sensor 10. A single manually operable push button 28 allows an operator to change the operational mode of the sensor and program the operational parameters of the sensor as will be described in more detail hereafter.

Figure 3:
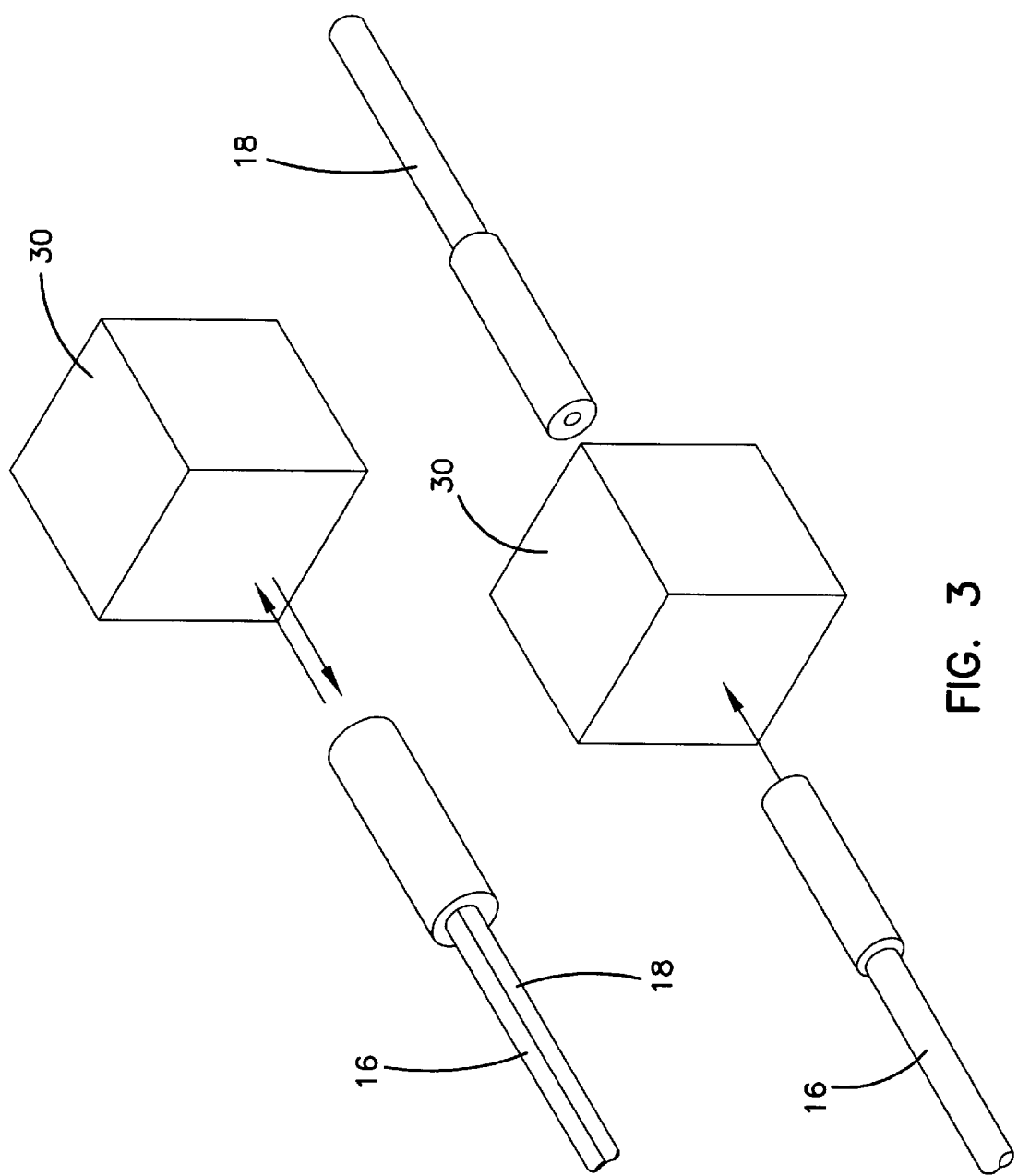
FIG. 3 is a view in perspective illustrating two modes of operation of the sensor of the present invention.

FIG. 3 illustrates two types of configurations or modes of object detection. As shown one configuration is a reflective mode where the modulated light emitted from sensor 10 strikes an object 30 and is reflected back to the receiver. In the other detection mode illustrated in FIG. 3, object 30 interrupts the modulated light beam emitted from fiber optic cable 16 and received by fiber optic cable 18. It should be understood as is well-known in the art that object detection sensors may also operate in modes other than those specifically shown in FIG. 3.

Figure 4:
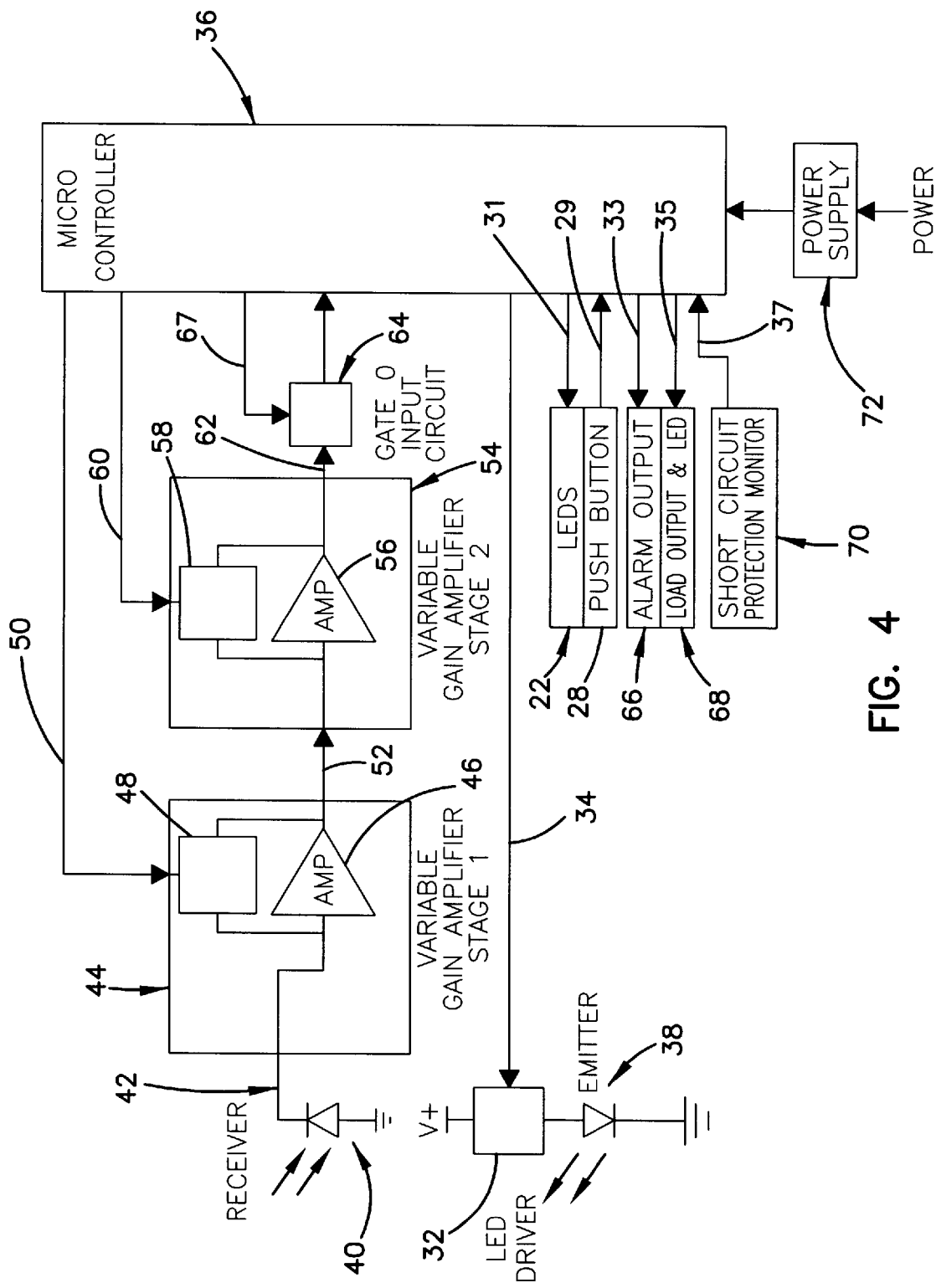
FIG. 4 is a block diagram illustrating the functional components of the sensor of the present invention.

FIG. 4 illustrates the sensor of the present invention in block diagram form. The sensor has an LED driver circuit 32 which is controlled by a signal indicated at 34 generated by a microcontroller 36. Driver circuit 32 drives a light emitting diode emitter 38 which emits a modulated light beam. Light emitting driver circuit 32 and emitter 38 are photoelectric sensor components well-known in the prior art. Sensor 10 has a photodetector or photosensor 40 which receives the modulated light returned to the photosensor generating an electronic signal at 42 representing the intensity of the received light. The signal at 42 is the input to a stage one variable gain amplifier circuit 44 which has an amplifier 46 and a switching circuit 48. Microcontroller 36 provides a signal at 50 to switching circuit 48 to adjust the gain of amplifier 46. Circuit 44 produces an output at 52 which is the input to a stage 2 variable gain amplifier circuit 54 that has an amplifier 56 and a switching circuit 58. Microcontroller 36 provides control signals as shown at 60 to switching circuit 58 to regulate the gain of amplifier 56. The output of amplifier circuit 54 is an amplified analog signal at 62 representing the intensity of the light received by the photodetector 40. The signal at 62 is the input to a gated input circuit 64 which is controlled by a signal at 67 from microcontroller 36. Gated input circuit 64 transmits the signal at 62 to microcontroller 36 in a manner that insures that the transmsitted signal represents the light returned from the emitted light beam instead of light detected from an extraneous source. The function, operation and components of gated input circuit 64 are well-known in the prior art.

Also illustrated schematically in FIG. 4 is the single manually operable push button 28 which provides sensor configuration mode change signals and Teach Mode programming signals shown at 29 to microcontroller 36 as described later. Microcontroller 36 generates signals shown at 31 controlling light emitting diode display 22. Also shown in FIG. 4 is an alarm output circuit 66 controlled by a signal 33 from microcontroller 36 and a load output circuit 68 controlled by a signal 35 from microcontroller 36. The sensor also has a short circuit protection monitor circuit 70 which provides a signal shown at 37 to microcontroller 36. The function and operation of the circuit 66, 68 and 70 will be described in more detail with reference to the detailed schematics FIGS. 5–7 of the circuitry of sensor 10. Finally, FIG. 4 shows a power supply 72 providing power to microcontroller 36.

Figure 5:
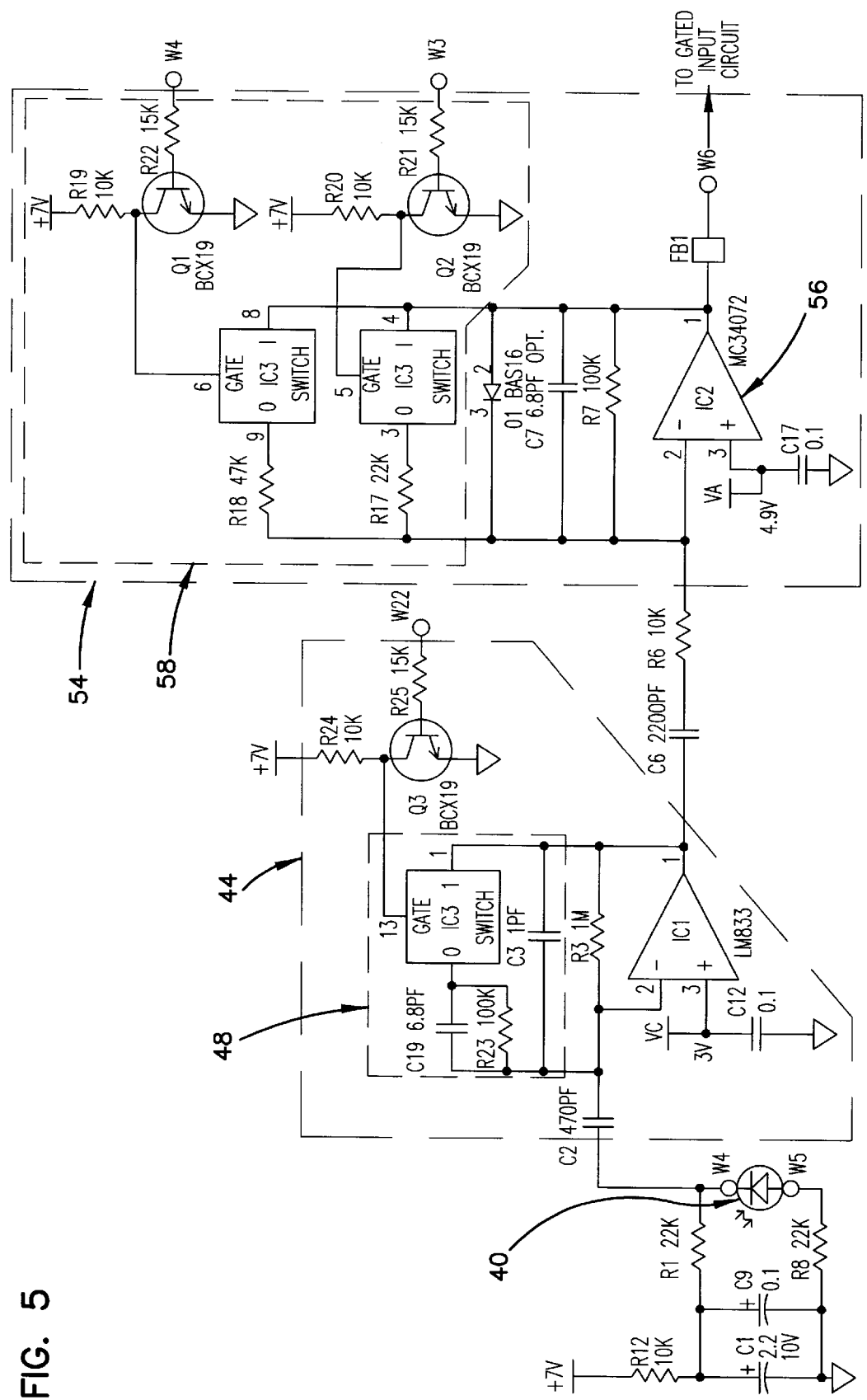
FIG. 5 is an electrical schematic of certain functional components shown in FIG. 4.

Referring to FIG. 5 the first stage variable gain amplifier circuit 44 and the second stage variable gain amplifier 54 are shown in more detail. First, photodiode 40 is connected to ground at W5. At W4 photodiode 40 is connected through a resistor R1 and a resistor R12 to a source of input voltage which in this preferred embodiment is plus 7 Volts. Connected in parallel between resistor R1 and R12 are a pair of capacitors C1 and C9 which are in turn connected to ground. A resistor R8 is connected between capacitors C1 and C9 and W5. The current through photodiode 40 depends upon the returned modulated light that is received by the sensor. More particularly, the magnitude of the current through photodiode 40 is based upon the intensity of the received light. Photodiode 40 is connected through a capacitor C2 to the input of amplifier 46 also designated IC1 in FIG. 5. A reference input of amplifier 46 is connected to a source of positive voltage and a capaciator C12 which is connected to ground. In the preferred embodiment shown herein the reference voltage input to amplifier 46 is +3 Volts. A capacitor C3 and a resistor R3 are connected between the input and output of amplifier 46. Also connected between the input and output of amplifier 46 is a switching circuit 48 which comprises a switch IC3 which is connected between the output of operational amplifier 46 and a parallel resistor/capacitor combination R23 and C19. Switch IC3 has a gate input that is connected to the collector of a transistor Q3. The emitter of transistor Q3 is connected to ground and a resistor R4 is connected between the collector and a source of voltage which in the preferred embodiment illustrated is +7 Volts. The base of transistor Q3 is connected through a resistor R25 to port 18 on microcontroller 36 as shown in more detail in FIG. 6. The signal generated by the microcontroller at port 18 represents the signal shown at 50 in FIG. 4. Signal 50 functions to switch the state of transistor Q3. This functions to control the switch IC3. In one state of IC3 capacitor C19 and resistor R23 are switched into the circuit between the input of amplifier 46 and its output, and in the other state of switch IC3, capacitor C19 and resistor R23 are disconnected from the circuit. In this manner the gain of amplifier 46 may be switched between two different gain settings.

The output of amplifier 46 is an amplified analog signal and is connected through a capacitor C6 and a resistor R6 to stage 2 of variable gain amplifier 54. Operational amplifier 56 is also designated as IC2 and has an input connected to resistor R6 and a reference input connected to a reference voltage which in the preferred embodiment illustrated is 4.9 Volts. The reference input of operational amplifier 56 is also connected through a capacitor C17 to ground. The output signal from operational amplifier 46 is therefore the input signal to operational amplifier 56. A parallel resistor and capacitor combination, R7 and C7, is connected between the output and input of operational amplifier 56. Also connected between the output and input of amplifier 56 is a diode D1 and switching circuit 58. Switching circuit 58 includes a first switch IC3 and resistor R18 which are connected in parallel with a second switch IC3 and resistor R17. Each switch and associated resistor is connected between the output and input of operational amplifier 56. A gate input of the first switch IC3 is connected to the collector of a transistor Q1. The emitter of transistor Q1 is connected to ground and the collector is connected through a resistor R19 to a +7 Volt power source. The base of transistor Q1 is connected through a resistor R22 to port 16 on microcontroller 36. A gate input to the second switch IC3 of switching circuit 58 is connected to the collector of a transistor Q2. The emitter of transistor Q2 is connected to ground and its collector is connected through a resistor R20 to a positive 7 Volt power source. The base of transistor Q2 is connected through a resistor R21 to port 17 on microcontroller 36. Microcontroller 36 produces output signals at ports 16 and 17 that switch the state of transistors Q1 and Q2, respectively. In a similar manner as described with respect to switching circuit 48, the state of these transistors control the switching of resistors R18 and R17 into and out of the circuit thereby enabling the gain of operational amplifier 56 to be switched between 4 discrete settings. The outputs at microcontroller ports 16 and 17 represent the control signals illustrated at 60 in FIG. 4. The output of operational amplifier 56 is thus a further amplified analog signal having an amplitude representing modulated light intensity received by the photosensor. This analog signal from operational amplifier 56 is the input signal to gated input circuit 64 which is again shown in block diagram form in FIG. 4 and in FIG. 6.

Figure 6:
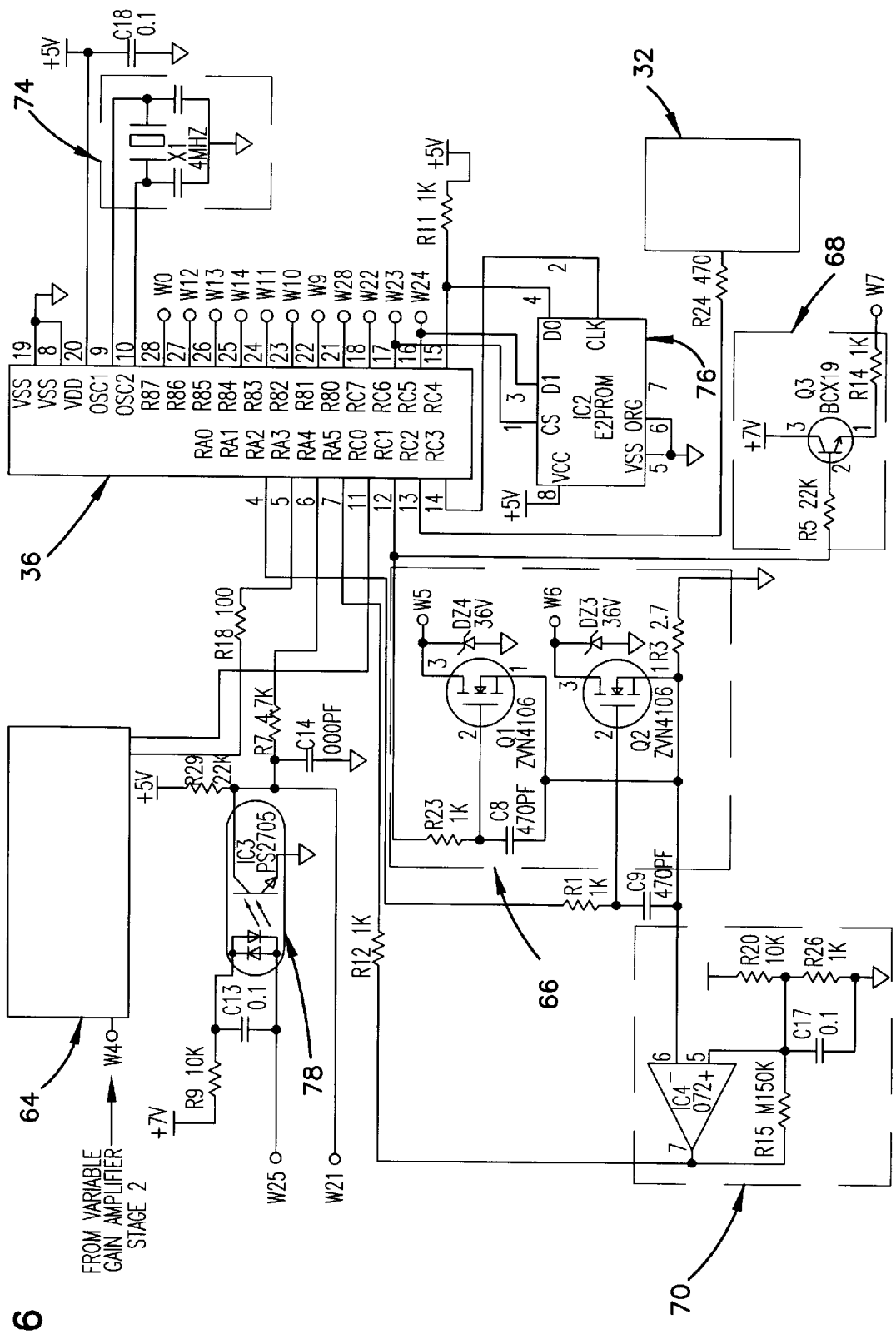
FIG. 6 is an electrical schematic of certain functional components shown in FIG. 4.

Referring now to FIG. 6, port 11 of microcontroller 36 is connected to gated input circuit 64. Microcontroller 36 generates an output signal at port 11 to control the gated input circuit in a manner well-known in the prior art so that the output signal from gated input circuit 64 that is the input to microcontroller 36 truly represents that pulse modulated light emitted by the photosensor which is then returned to the photosensor. The output signal of gated input circuit 64 is connected as the input to microcontroller 36 through a resistor R18 at port 5. Microcontroller 36 includes an analog digital converter that converts the analog signal at port 5 into a digital signal representing the intensity of the returned light received by the photosensor. Microcontroller 36 compares the received signal with a predetermined switching threshold and generates an output signal at port 12 controlling the state of the photosensor output. If, for example, assuming the photosensor is operated in the light operate (LO) mode, if the received signal exceeds a switching threshold the microcontroller will turn the output on. If the received signal does not exceed the light operate threshold value the output will remain off. If the received signal decreases below the light operate off value, the microcontroller turns the output off.

The microcontroller output signal at port 12 is connected through a resistor R23 and capacitor C8 combination to the base of a field effect transistor (FET) Q1. Capacitor C8 is connected through a resistor R3 to ground. The output of FET Q1 at pin W5 is the output signal of sensor 10 that may be used to control a function in an industrial application. The output signal at port 12 of microcontroller 36 functions to turn FET Q1 on and off in response to the modulated light that is received by the photosensor representing the presence, absence or condition of an object in the path of the emitted light beam. A zener diode DZ4 is connected across the output of FET Q1 to ground to provide surge protection.

Figure 2:
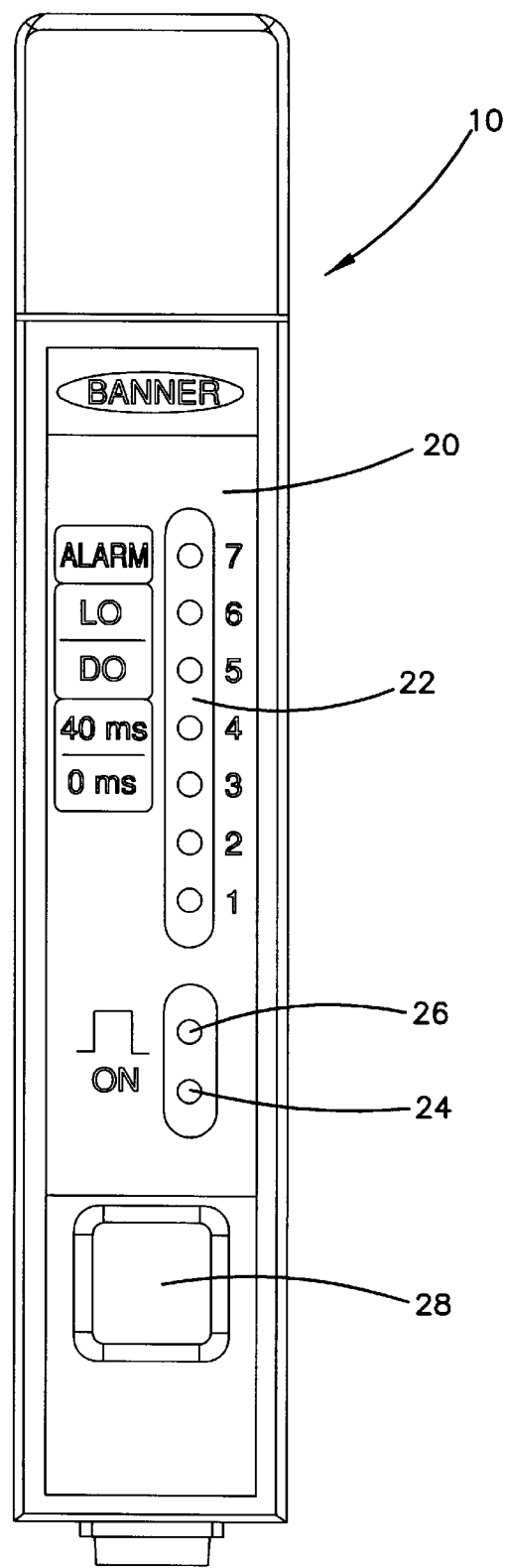
FIG. 2 is an elevational view of the sensor shown in FIG. 1.
Figure 7:
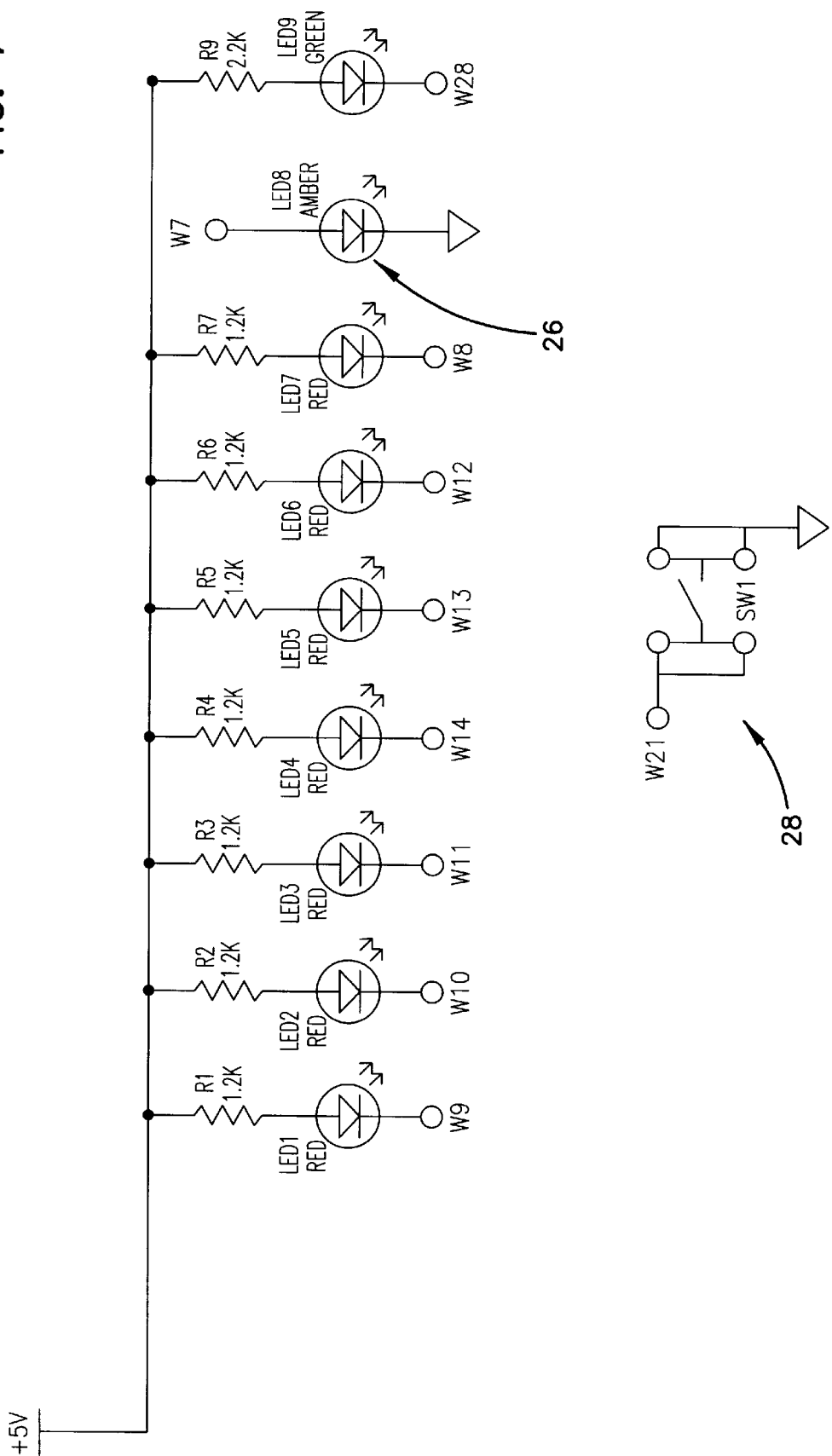
FIG. 7 is an electrical schematic of certain functional components shown in FIG. 4.

The output signal at port 12 of microcontroller 36 is also connected through a resistor R5 to the base of a transistor Q3. The emitter of transistor Q3 is connected to a resistor R14 and the collector of transistor Q3 is connected to a positive 7 Volt power source. Transistor Q3, resistor R5 and resistor R14 together comprise the output LED drive circuit. Through resistor R14 the emitter of transistor Q3 is connected to light emitting diode 26 as shown in FIG. 2 and FIG. 7. Diode 26 also bears the designation LED8 on FIG. 7. Diode 26 is turned on and off by the output signal at port 12 of microcontroller 36 as the output switches state.

Alarm signal circuit 66 includes a field effect transistor (FET) Q2 with a base connected through a resistor R1 to port 4 on microcontroller 36. The base of FET Q2 is connected through capacitor C9 and resistor R3 to ground. FET Q2 is also connected to ground through resistor R3. The output of FET Q2 is at pin W6. A surge protection zener diode DZ3 is connected between ground and point W6. Microcontroller 36 generates a signal at port 4 to turn on FET Q2 of alarm circuit 66 when the signal that controls the output begins to degrade. In other words, the signal that controls the output may decrease even though its value may still be enough to exceed the threshold. Microcontroller 36 detects this degradation providing an alarm signal at point W6. The signal may be connected to a computer or a programmable logic controller to provide a remote alarm indication.

Short circuit overload protection circuit 70 includes a comparator IC4 with an input connected through resistor R3 to ground. The other input of comparator IC4 is connected through a capacitor C17 to ground. Connected in parallel with capacitor C17 is a resistor R26. The parallel combination of capacitor C17 and resistor R26 is also connected through a resistor R20 to a 5 Volt power supply. A resistor R15 is connected between the output of comparator IC4 and an input. The output of comparator IC4 is connected through a resistor R12 to port 7 on microcontroller 36. Comparator IC4 monitors the voltage at W5 and W6 of the output circuit 68 and alarm circuit 66, respectively. When the voltage at either W5 or W6 exceeds a predetermined value, the output at pin 7 of IC4 goes high sending a signal to port 7 of microcontroller 36. This signal causes microcontroller 36 to turn off the output and alarm circuits to prevent component damage.

Microcontroller 36 has a port 13 which is connected through a resistor R24 to LED driver circuit 32. Microcontroller 36 generates a signal at port 13 which is represented at 34 on FIG. 4 to control the generation modulated light from emitter 38. An oscillator circuit 74, the components of which are well-known in the art, provide timing signals to microcontroller 36. Microcontroller 36 is powered through 5 Volt supply input at port 20. Associated with microcontroller 36 is a memory 76 also bearing the indication IC2 and E2PROM. Memory 76 stores the operational parameters and sensor configuration options (SCOs) of the sensor. Thus, when the sensor is turned on after being turned off the sensor will automatically be set to operate in the mode and under the operating parameters previously set before it was turned off. Microprocessor ports 22, 23, 24, 25, 26, 27 and 28 are connected to light emitting diodes (LEDs) 1–7 as shown specifically in FIG. 7. Referring to FIG. 7 each of LEDs 1–7 is connected through a resistor indicated respectively as R1–R7, to a 5 Volt power source. Microcontroller 36 generates signals at ports 22–28 that control LEDs 1–7 as will be described in more detail hereafter. Light emitting diode (LED) 9 is connected through a resistor R9 to the 5 Volt power supply and also to port 21 on microcontroller 36. Microcontroller 36 generates a signal at port 21 to turn on LED9 when the sensor is powered on. When the sensor is off LED 9 is extinguished. The single manually operable push button 28 is shown in FIG. 7. When depressed by the operator switch 28 connects point W21 to ground. Point W21 is connected through a resistor R29 to a 5 Volt power source as shown in FIG. 6. Point W29 is also connected through a resistor R7 to port 6 of microcontroller 36. A capacitor C14 is connected between point W21 and ground. Switch 28 provides a signal input at port 6 of microcontroller 36 to interrogate the sensor, change the operating mode of the sensor, and/or program the sensor as will be described in more detail hereafter.

The function of push button 28 may also be accomplished by a single electronic switching means. With reference to FIG. 6, an optoisolator 78 also bearing the indicia IC3, has an output connected through resistor R29 to a 5 Volt power source. Optoisolator 78 is also connected through resistor R9 to a 7 Volt power source and a capacitor C13 is placed across the input of optoisolator 78. The input of optoisolator 78 is connected to a point W25. This point may be connected to a remote controller providing a signal simulating the push button if one wishes to program the sensor remotely. In any event push button 28 or opto isolator 78 generates an input signal at port 6 by causing the signal at point W21 to go low.

The operation of sensor 10 will now be described with particular reference to the flow charts of FIGS. 9–13 and FIG. 8. The sensor initiation routine is illustrated in FIG. 9. In step 100 the sensor is turned on or powered up. When that occurs microcontroller 36 retrieves the sensor operating modes and parameters that are stored in memory 76. The sensor operating modes may be referred to as the Sensor Configuration Options. These include light operate (LO), dark operate (DO), output off delay of zero or 40 msec. These Sensor Configuration Options may be set at the factory or by the operator during sensor programming. Also stored in memory 76 is the amplifier gain setting, and amplitude of the signal received by the photosensor in the target and background states. At each power up and at each completed Teach Mode the data in memory 76 is analyzed by microcontroller 36 to establish the sensor Operation Parameters. The Operation Parameters include: amplifier gain, output threshold values, hysteresis value, alarm threshold value, and display function values. These values are stored in memory 76 and quantified as explained below. In step 101 the determination is made as to whether or not the data stored in the memory is good data. If the data is bad or cannot be accessed microcontroller 36 generates signals that cause LED2 and LED7 to flash continuously. The sensor does not enter the Run Mode. If the values are determined in step 102 to be good data the process proceeds to step 103 where the operational parameters are set based upon the data and at step 104 the sensor begins the Run Mode.

Run Mode

Figure 10:
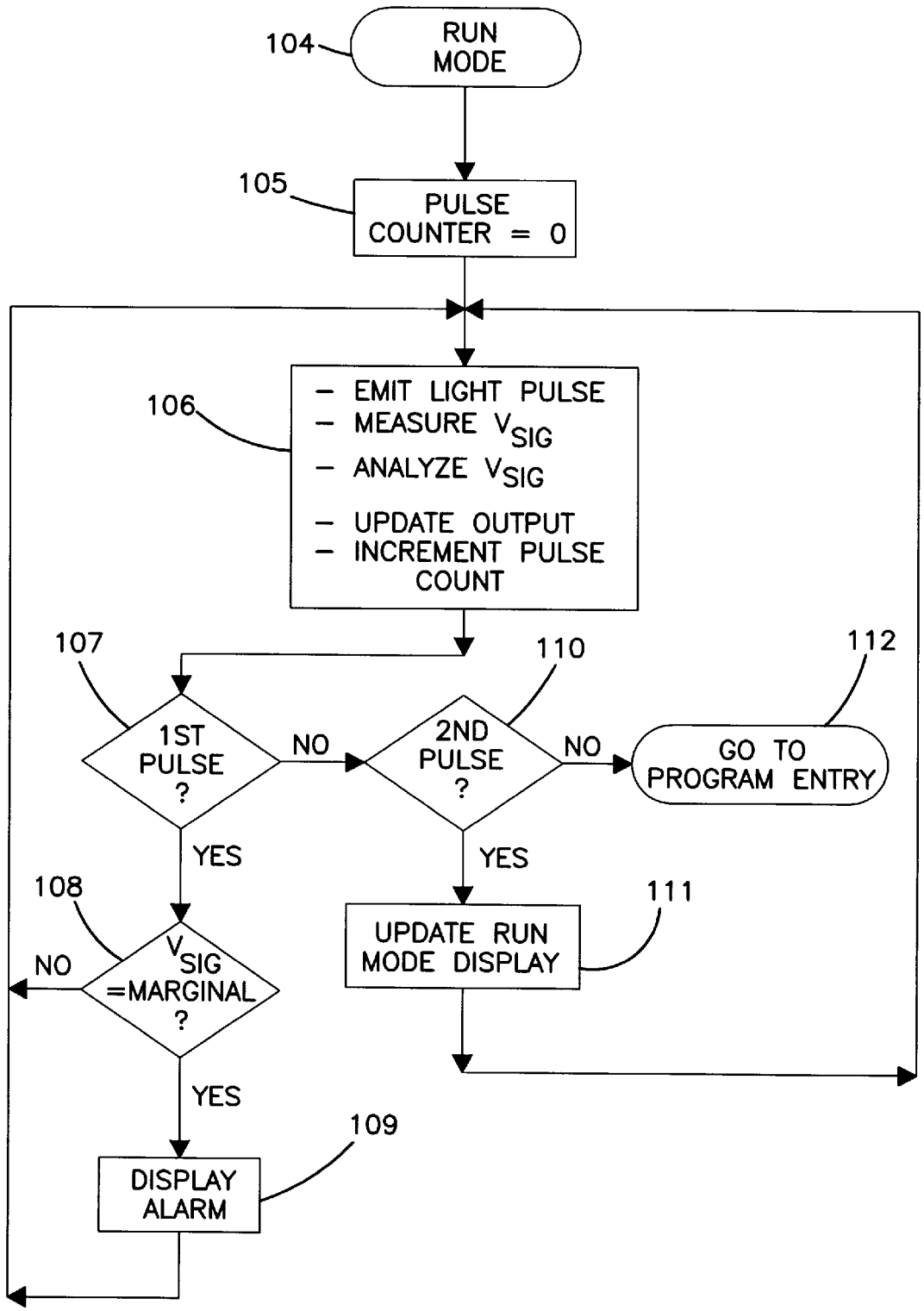
FIG. 10 is a flow chart illustrating the sensor operation in the Run Mode.

The Run Mode of sensor operation will be described with reference to FIG. 8 and FIG. 10.

Figure 8:
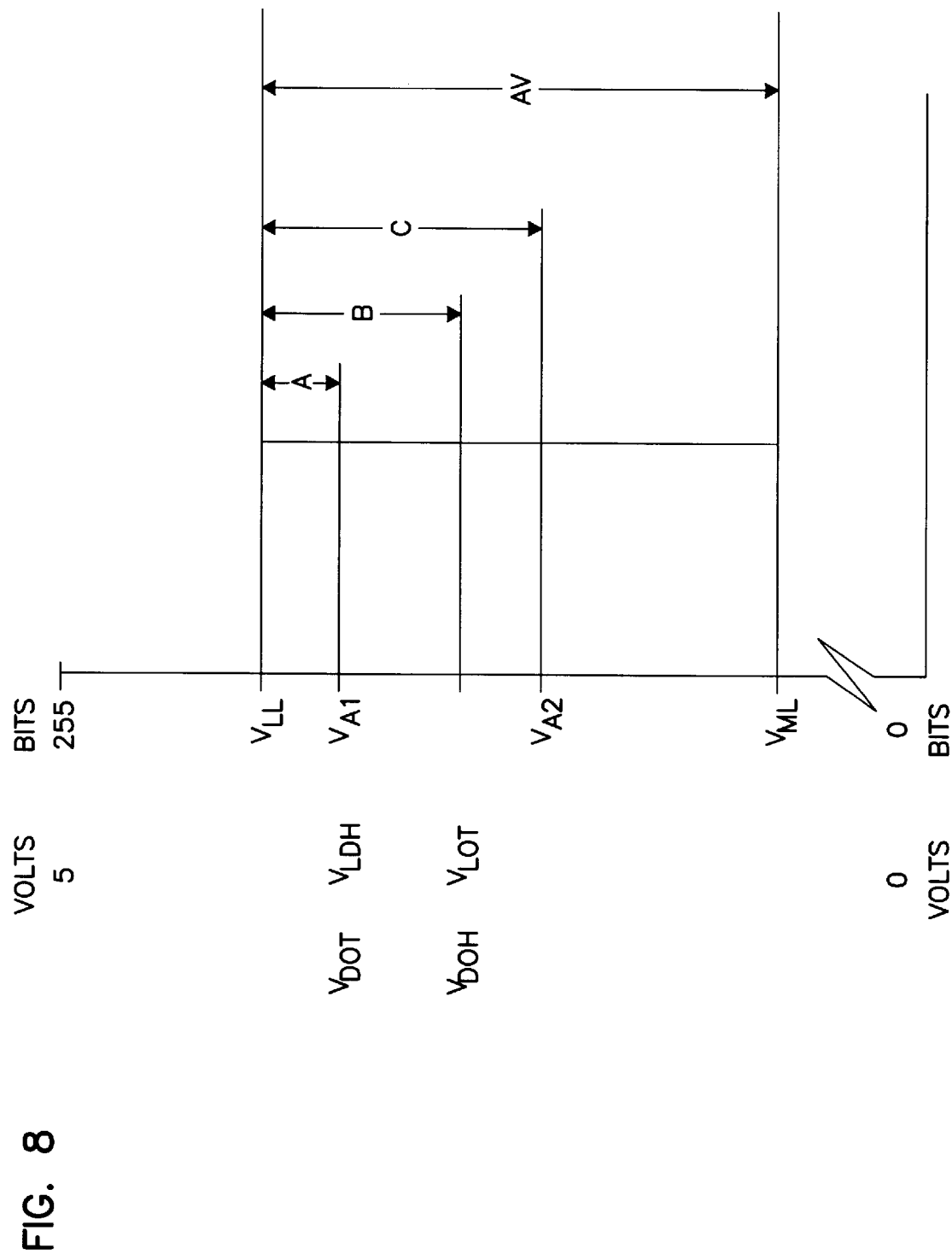
FIG. 8 is a signal chart useful for illustrating the operation of the sensor of the present invention.
Figure 9:
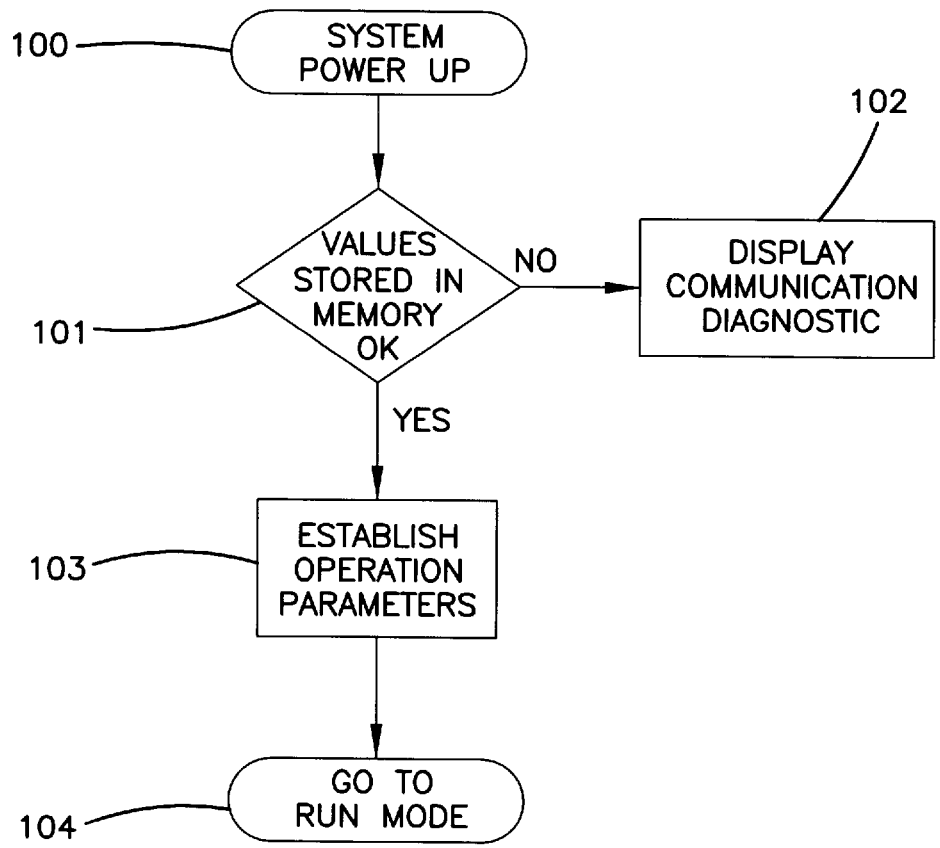
FIG. 9 is a flow chart illustrating the sensor initiation routine.

First, FIG. 8 illustrates the various signals of interest representing the light returned and detected by the photosensor. In the preferred embodiment disclosed herein the analog signal input at port 5 of microcontroller 36 varies between 0 and 5 Volts. This signal is converted to a digital signal in microcontroller 36. The 0 to 5 Volt analog signal corresponds to a digital signal of 0 to 255 bits. The following list defines the signals on FIG. 8.

$V_{LL}$= the signal measured at the optimum gain setting for the least light received by the photosensor during the least light target condition measurement.

$V_{ML}$= the signal measured at the optimum gain setting for the most light received by the photosensor during the most light target condition measurement.

$V_{DOT}$= Dark Operate threshold value $V_{DOH}$= Dark Operate hysteresis value $V_{LOH}$= Light Operate hysteresis value $V_{LOT}$= Light Operate threshold value $V_{A1}$= first marginal signal alarm value $V_{A2}$= second marginal signal alarm value $\Delta V$= difference between $V_{LL}$ and $V_{ML}$ It will be appreciated that in the preferred embodiment disclosed herein the sensor is designed to generate the largest signal for the least received light and the smallest signal for the greatest received light. It would be within the skill in the art to also design the sensor so that the greatest received light generated the largest signal and the least received light generated the smallest signal.

The values $V_{DOT}$, $V_{DOH}$, $V_{LOH}$, $V_{LOT}$, $V_{A1}$, and $V_{A2}$ are established by microcontroller 36 as described in more detail below.

In the Run Mode a pulse counter is set at zero as shown in step 105. At step 106 a modulated light pulse is emitted by emitter 38. The signal ($V_{SIG}$) representing the returned light detected by receiver 40 is measured and analyzed. The output logic in microcontroller 36 is updated. It takes three measured signals above or below the sensor switching thresholds to cause the output to change state. The pulse counter is incremented. At 107 if it is the first pulse, the determination is made at 108 as to whether the detected signal is marginal. If the signal is marginal, at step 109 an alarm indication (LED 7) on bar graph display 22 is turned on. If the signal is not marginal the process returns to step 106. If the second pulse is emitted at step 110, the Run Mode Display logic is updated for providing a visual display of the detected signal strength on bar graph display 22 at step 111. The process then returns to step 106. At step 112 the microcontroller 36 goes to Program Mode Entry where it looks for signal indication that the push button 28 has been pushed and held for 2 seconds or greater. If not, the program returns to the Run Mode.

Program Mode Entry

The sensor is programmed by using a single switch means which in the preferred embodiment disclosed herein is either a manual push button 28 or an electronic switch serving the same function as described in detail above. For the purpose of this discussion reference will be made to using push button 28. Programming of the sensor is done using push button 28 and feedback from LED 24 and the LEDs of bar graph display 22. Push button 28 is used for making sensor configuration selections and for initiating the Teach Mode operation. LED bar graph display 22 guides the operator through the Program Mode operation and also provides signal intensity information for proper target positioning during the Teach Mode target set-up. The Program Mode operation can only be accessed after completing a precise push button sequence during the Run Mode operation. This push button sequence is referred to as the Program Mode Entry Code and its use serves to minimize unintended Run Mode operation interruptions and unauthorized Program Mode changes.

Figure 11:
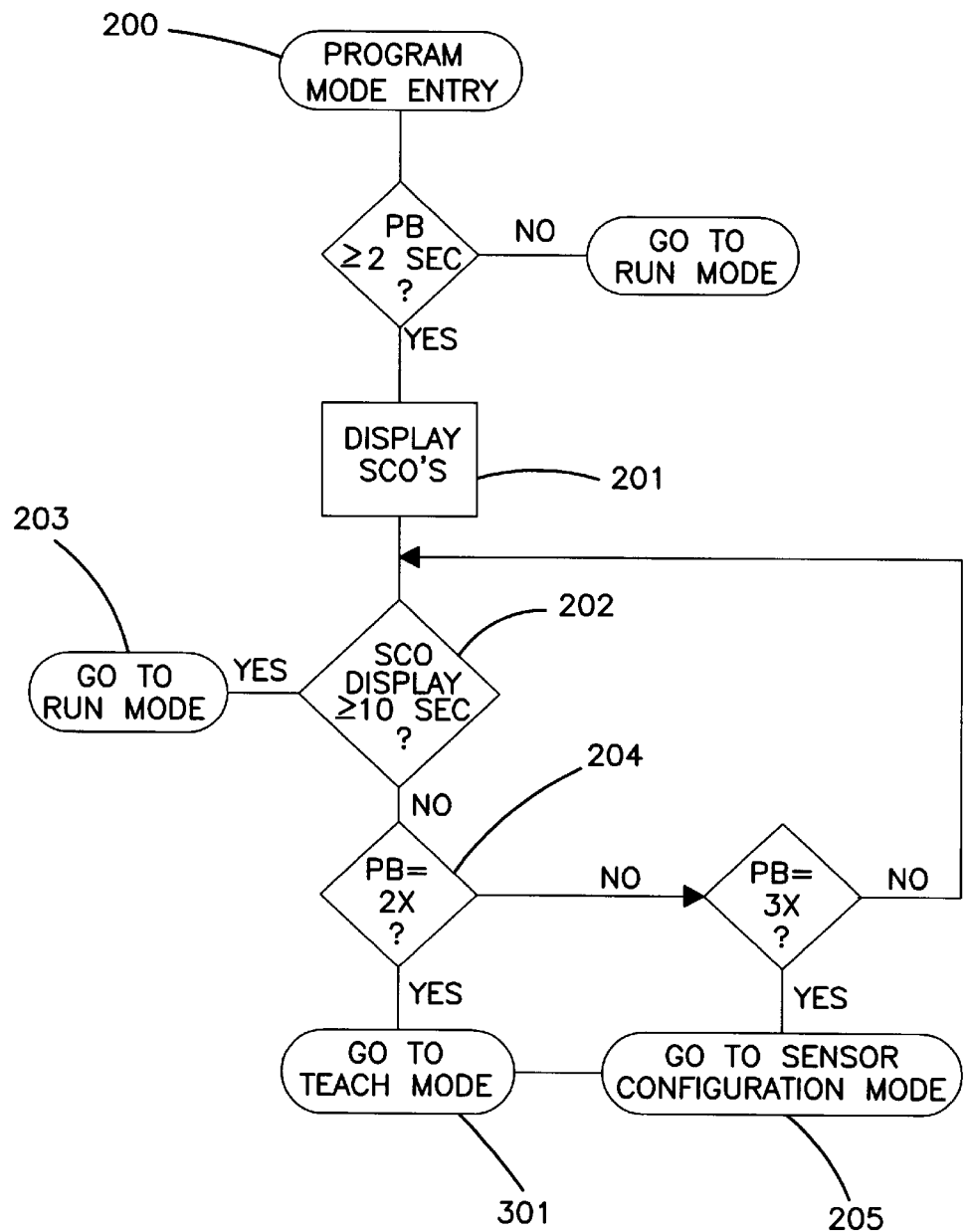
FIG. 11 is a flow chart illustrating the sensor Program Mode Entry routine.

To enter the Program Mode at step 200 in FIG. 11, push button 28 is pushed and held for at least 2 seconds. After this 2-second interval at step 201 the active Sensor Configuration Options (SCO's) are displayed by the LED graph display 22. For example, if the sensor is operated in the zero msec. Off Delay mode, the LED adjacent that indicia on faceplate 20 will be illuminated. Conversely if the sensor is operating in the 40 msec. Off Delay mode the LED adjacent that indicia on faceplate 20 will be illuminated. In similar manner either the Light Operate (LO) or Dark Operate (DO) LED's will be illuminated. The active SCO LED's will be illuminated for 10 seconds. Though the sensor is still in the Run Mode at this time, the Run Mode display of bar graph display 22 is temporarily suspended. At step 202 after the 10 second SCO display interval is over, the display returns to the Run Mode at step 203. Within the 10-second interval as shown at step 204 if push button 28 is pressed 3 short times the sensor goes to the Sensor Configuration Mode as indicated at step 205. If push button 28 is pressed 2 short times the sensor goes to the Teach Mode as indicated at step 301.

Sensor Configuration Mode

Figure 12:
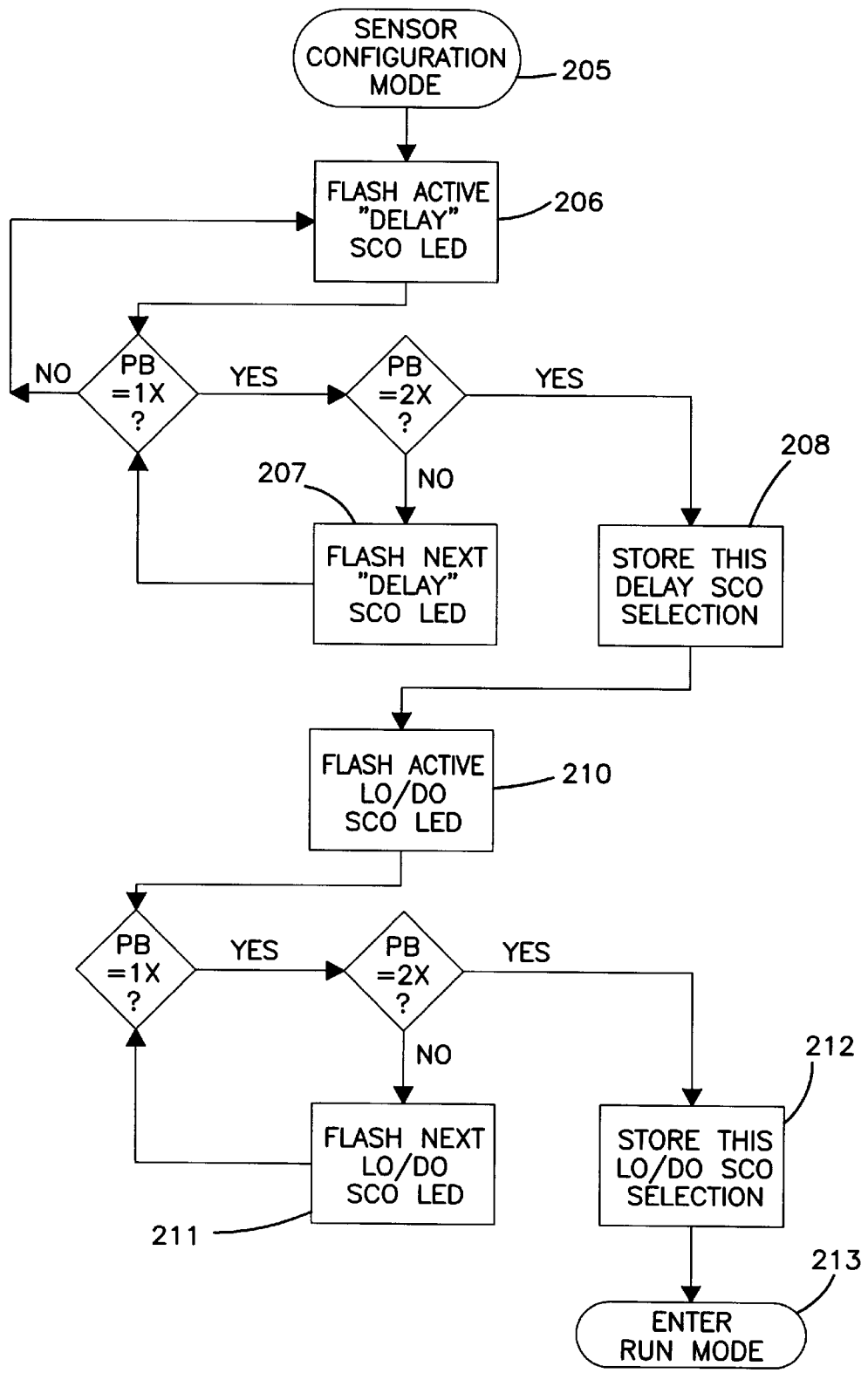
FIG. 12 is a flow chart illustrating the sensor Configuration Option and Programming Mode Routine.
Figure 13A:
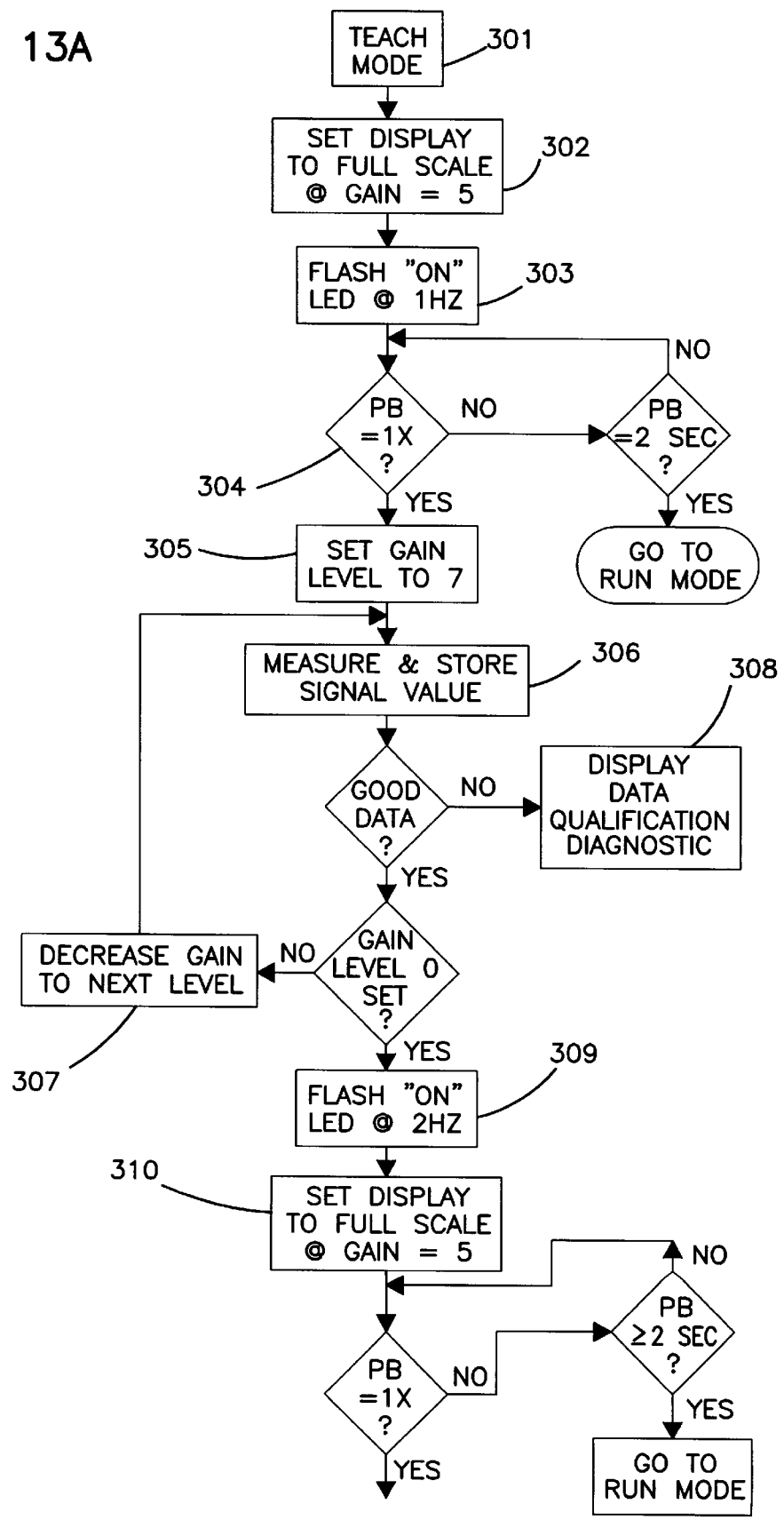
FIGS. 13A and 13B a flow chart illustrating the sensor Teach Mode routine.
Figure 13B:
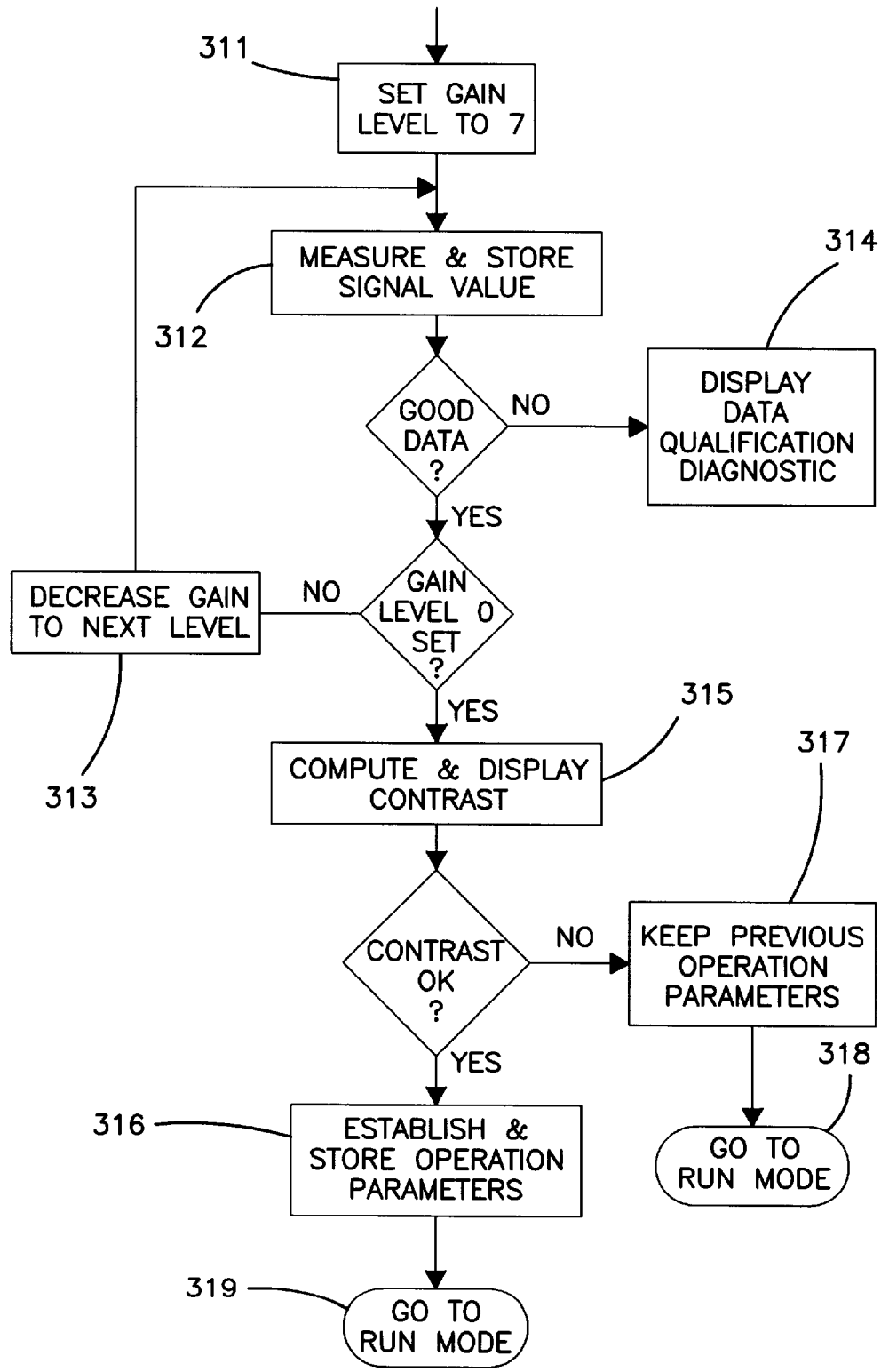

The Sensor Configuration Mode is shown in FIG. 12. The Sensor Configuration Mode operation begins at step 206 where the LED corresponding to the current Off Delay mode setting of the sensor begins flashing. This provides an indication to the operator of the Off Delay currently being used by the sensor during the Run Mode. If the operator wishes to change the Off Delay push button 28 is pressed once. As shown at step 207 this causes the LED corresponding to the new Off Delay selection to flash. Pressing push button 28 again one short time switches the Off Delay back to the original setting and the LED corresponding to that setting begins to flash. Thus, pressing push button 28 for one short time toggles the Off Delay selection between the two choices. This toggle action can be repeated indefinitely.

When the operator wishes to enter an Off Delay selection, push button 28 is pressed 2 short times and as shown at step 208 this then stores the Off Delay SCO setting. Following step 208 the LED corresponding to the LO or DO mode begins to flash at step 210 corresponding to the mode in which the sensor is currently set. Pressing push button 28 once switches the sensor to the other of the LO/DO modes causing the other of the two corresponding LEDs to flash as shown in step 211. As described above pressing push button 28 once continues to toggle the sensor back and forth between the two LO/DO modes. Pressing push button 28 two short times stores the LO/DO mode selection as shown in step 212 from which the sensor then enters the Run Mode as illustrated at 213.

Teach Mode

The Teach Mode begins at step 301. At step 302 the LED bar graph display is set to full scale at a gain setting of 5.

Step 303 illustrates the flashing of LED 24 at 1 Hz. This signifies that the sensor is waiting for the first target to be presented so that the sensor can measure and record the signal values at different amplifier gain levels. The LED display 22 is "scaled" such that each LED represents about 700 mV. of signal. The greater the amount of light returned to the photosensor, the greater the number of LEDs illuminated on bar graph display 22. The display function is incorporated to help the operator properly position the target within the sensing zone. The feedback through the LED bar graph display gives the operator information concerning the amount of light returned to the photosensor. The operator can determine where in the sensing zone the target should be located to optimize the maximum light or minimum light conditions. This display function of the LED bar graph display is referred to as the Teach Mode Intensity Display.

When the first target is in place, which for example may be a target object, the operator presses the button 28 one short time as shown at step 304. Then at step 305 the amplifier gain is set to level 7. Microcontroller 36 causes the LED driver circuit 32 and emitter 38 to generate a series of modulated light pulses. A certain amount of this emitted light is returned to the photosensor and received by photodetector 40. The signal value at the first gain setting is stored at step 306. During the emit, measure and record routine the Teach Mode Intensity Display function is temporarily suspended and replaced by the Teach Mode Process Display function. During this display function each of the light emitting diodes of bar graph display 22 turns On and Off sequentially starting with light emitting diode 7 and ending with light emitting diode 1. If the data that is measured is good the variable gain amplifiers are set to the next lower level as shown at step 307 and the emit, measure and store process is repeated until data is stored for all eight gain settings 0–7. If during this process the data is not good microcontroller 36 causes LEDs 7 and 1 to flash three times and the sensor returns to the Run Mode with the sensor's previously set operational parameters. This display is referred to as the Display Data Diagnostic Qualification function and is illustrated at step 308. Once data has been collected at all gain settings with respect to the first target, at step 309 LED 24 is caused to flash at a frequency of 2 Hz to signify to the operator that the second condition of the sensor, or the second target, should now be established. This second condition may, for example, correspond to the background state of the sensor. At step 310 the LED bar graph display 22 is again set to full scale at a gain setting of 5. The sensor is now back in the Teach Mode Intensity Display. Once the second target is properly positioned, the operator depresses push button 28 one short time and the sensor goes through the same routine of emitting, measuring and storing the return signal values at each of the sensor gain settings for the second target. At step 311 the gain is set at setting 7. Step 312 shows the emit, measure and storage of the signal step. Step 313 illustrates decreasing the gain a level at a time until data has been stored at all gain settings. Step 314 illustrates the Display Data Diagnostic Qualification mode described above. Once good data has been stored for the first and second targets, at step 315 microcontroller 36 analyzes the data and determines the difference between the signal values and the target state and the background state at each gain level. As stated earlier this difference may be referred to as the contrast. Microcontroller 36 selects a gain and establishes the Light Operate and Dark Operate threshold value as well as the hysteresis threshold values according to the rules stated later in this description. The gain is established by microcontroller 36 generating signals to set the gain as described above. This step is illustrated at 316 where the gain and operational parameters of the sensor are stored in memory. When the appropriate gain level is selected an indication of the approximate difference between the signals in the target and background state are displayed on the LED bar graph display 22. This is referred to as the Contrast Indication Display. The larger the difference between the two signals the greater number of LEDs are illuminated on bar graph display 22, If the difference between the signal values in the two states is very small such that microcontroller 36 cannot reliably differentiate between the two, at step 317 microcontroller 36 reverts to the previously established or factory set operational parameters and proceeds to the Run Mode at step 318. Under this condition microcontroller 36 also causes LED1 on the bar graph display 22 to flash. After selecting the appropriate gain in step 316 and displaying the approximate difference between the two signals on the LED bar graph display 22 the sensor proceeds to the Run Mode at step 319. The following is a chart showing the number of light emitting diodes on bar graph display 22 that are illuminated when the difference between the target and background signals are compared and a characterization of contrast.

| LEDs Illuminated | Contrast Indication |
| --- | --- |
| 1 | Not Acceptable |
| 1-2 | Low |
| 1-3 | Moderate |
| 1-4 | Good |
| 1-5 | Very Good |
| 1-6 | High |
| 1-7 | Very High |

Gain Selection Rules

If the difference between the amplitude of the signal at port 5 of microcontroller 36 in the first target state and the second target state (i.e. "background") is less than one Volt (or about 50 bits in digital form since each bit corresponds to 0.0196 volts), the gain is set at the gain level that maintains the greatest difference. This is a low contrast application. The rule insures that in such low contrast applications the gain is set to maximize the difference in the signal received by the photosensor in the first and second states.

If the difference between the first target state and the second target state is greater than or equal to one Volt, the gain is set at the maximum gain level that will maintain or increase the difference. In other words, the gain is set at the highest gain level that results in a signal difference greater than or equal to one volt. This rule maximizes the excess gain performance of the sensor in applications that permit it.

Excess gain is generally defined as measure of light received by the photodetector over and above the amount required to cause the sensor output to change state. Excess gain may be measured as the voltage at the input port of microcontroller 36 compared to the sensor switching threshold voltage. For example, if the voltage at port 5 equals the threshold voltage the sensor is said to have an excess gain "1x" or "one times" the threshold voltage.

Output Operation Threshold, Hysteresis Threshold and Alarm Threshold Rules

Microcontroller 36 also automatically sets the output threshold, hysteresis threshold and alarm threshold levels of the sensor based on the comparison between the signals measured in the first and second target states. In the prior art these values are pre-set by the photosensor manufacturer and cannot be adjusted.

Hysteresis is a design consideration to prevent the output of the sensor from "buzzing" or "chattering" when the detected signal at port 5 is at or near the switching threshold level. For example, with reference to FIG. 8, the $V_{DOT}$ level is the threshold above which the sensor output will conduct, indicating the least light condition is detected by the photodetector with the sensor in the Dark Operate mode. The sensor output will not switch states until the detected signal drops below the level indicated as $V_{DOH}$ (Dark Operate hysteresis value).

Microcontroller 36 establishes the output thresholds, hysteresis thresholds, and alarm thresholds according to the following rules:

$V_{DOT}=V_{LL}-A$ bits $V_{DOH}=V_{LL}-B$ bits $V_{LOH}=V_{LL}-A$ bits $V_{LOT}=V_{LL}-B$ bits $V_{A1}=V_{LL}-A$ bits $V_{A2}=V_{LL}-C$ bits $\Delta V=V_{LL}-V_{ML}$

| | Bit Table | | |
|---|---|---|---|
| ΔV | A | B | C |
| 4 | 1 | 3 | 3 |
| 5 | 1 | 4 | 4 |
| 6 | 1 | 5 | 5 |
| 7 | 1 | 5 | 5 |
| 8 | 1 | 5 | 6 |
| 9 | 2 | 6 | 7 |
| 10 | 2 | 6 | 7 |
| ≧11 | 2 | 6 | 8 |

Each bit=0.0197 Volts which is the smallest signal value that microcontroller 36 can resolve (5 Volts/255 bits).

Run Mode LED Bar Graph Display

During the Run Mode, microcontroller 36 causes the LEDs of LED bar graph display 22 to be illuminated as follows:

For $\Delta V \geq 12$ Bits

LED 1 is on if $V_{LL} < V_{SIG} \leq V_{LOT}$

LED 2 is on if $V_{LOT} < V_{SIG} \leq V_{LOT}-V_1$

LED 3 is on if $V_{LOT}-V_1 < V_{SIG} \leq V_{LOT}-2V_1$

LED 4 is on if $V_{LOT}-2V_1 < V_{SIG} \leq V_{LOT}-3V_1$

LED 5 is on if $V_{LOT}-3V_1 < V_{SIG} \leq V_{LOT}-4V_1$

LED 6 is on if $V_{LOT}-4V_1 < V_{SIG} \leq V_{LOT}-5V_1$

LED 7 is on if $V_{LOT}-5V_1 < V_{SIG} \leq V_{LOT}-6V_1$

For $\Delta V \leq 12$ Bits

LEDs are off if $V_{DOT} \leq V_{SIG}$

LED 1 is on if $V_{LOT} \leq V_{SIG} < V_{DOT}$

LED 2 is on if $V_{LOT}-1BIT \leq V_{SIG} < V_{LOT}$

LED 3 is on if $V_{SIG} \leq V_{LOT}-1BIT$ $V_{SIG}$=the signal represented the light received by the photodetector and appearing at port 5 as an analog signal $$V_1 = \frac{\Delta V - V_{LOT}}{6}$$

From the above description it can be seen that the present invention is a detection sensor that can be easily and quickly programmed by the user. The operator may select the sensor operating mode and the sensor automatically sets certain sensor operating parameters. Therefore the sensor is set to optimum operating conditions for each application.

We claim:

1. In a sensor including an emitter which emits a detection signal such that the detected signal can be blocked by or reflected from an object and a detection means having a variable gain amplifier for generating an electronic signal representing the presence, absence or condition of the object, the sensor being configured to perform a method for automatically adjusting the gain of the variable gain amplifier comprising the steps of:

determining the amplitude of said electronic signal in a first state at each of a plurality of gain settings;

determining the amplitude of said electronic signal and a second state at the same plurality of gain settings;

comparing the amplitude of said electronic signal and said first and second stage at each of said gain settings;

and adjusting the gain of the variable gain amplifier to a gain setting based upon said comparison to maximize low contrast performance if the difference in amplitude in said first and second states is less than a predetermined value or maximize excess gain performance if said difference is equal to or greater than said predetermined value.

2. A method in accordance with claim 1 wherein the step of adjusting the gain of the variable gain amplifier further comprises the steps of:

determining whether or not the difference between the amplitude of the electronic signal in said first and second states is less than a predetermined value in each of said gain settings and, if so, adjusting the gain of the variable gain amplifier to a gain setting that maximizes said difference.

3. A method in accordance with claim 2 further comprising the steps of:

determining whether or not the difference between the amplitude of said electronic signal in said first and second states exceeds said predetermined value at at least one of said plurality of gain settings; and, if so, adjusting the gain of the variable gain amplifier to the maximum gain setting that will maintain said difference greater than or equal to said predetermined value.

4. In a sensor including an emitter which emits a detection signal such that the detection signal can be blocked by or reflected from an object and a detection means for generating an electronic signal representing the presence, absence or condition of the object, and switch means operatively connected to said detection means for generating a sensor output signal representing the presence, absence, or condition of the object, the sensor being configured to perform a method for automatically adjusting the signal threshold level at which the output signal of the sensor switches comprising the steps of:

determining the amplitude of said electronic signal in one state corresponding to the minimum detection signal received by said detection means;

determining the amplitude of said electronic signal in another state corresponding to the maximum detection signal received by said detection means;

comparing the amplitude of said electronic signal in said one and said another states; and adjusting the threshold signal level at which said output signal of said sensor switches based upon said comparison.

5. A method in accordance with claim 4 further comprising the step of establishing a hysteresis signal level based upon said comparison.

6. A sensor comprising:

emitting means for emitting a detection signal such that the detection signal can be blocked by or reflected from an object;

detecting means for generating an electronic signal representing the presence, absence, or condition of the object based upon the portion of the detection signal returned to the sensor and including a variable gain amplifier, said electronic signal having a first amplitude corresponding to a first state of said object and a second amplitude corresponding to a second state of said object;

switch means for providing multifunction programming of the sensor operational characteristics, said switch means generating a program signal;

processing means operatively connected to said emitting means, detecting means, and switch means, for controlling one or more operational characteristics in response to said program signal;

said processing means having means for determining said first amplitude and said second amplitude at each of a plurality of gain levels of said variable gain amplifier, and comparing first and second amplitudes at each of said gain levels;

said processing means providing a gain adjust signal to adjust the gain of said variable gain amplifier to a gain level to maintain the greatest difference between the first and second amplitudes if the difference at each of said gain levels is less than a predetermined value;

said processing means providing a gain adjust signal to adjust the gain of said variable gain amplifier to the maximum gain level that maintains the difference between the first amplitude and the second amplitude greater than or equal to said predetermined value when the difference between the first amplitude and second amplitude is equal to a greater than said predetermined value at at least one of said gain levels.

7. A sensor in accordance with claim 6 wherein said processing means further comprising means for establishing a sensor switching threshold based upon a comparison of the first amplitude with said second amplitude.

8. A sensor in accordance with claim 6 wherein said processing means further comprises means for establishing a sensor hysteresis value based upon a comparison of the first amplitude with said second amplitude.

9. A sensor comprising:

emitting means for emitting a detection signal such that the detection signal can be blocked by or reflected from an object;

detecting means for generating an electronic signal representing the presence, absence, or condition of the object based upon the portion of the detection signal returned to the sensor and including a variable gain amplifier, said electronic signal having a first amplitude corresponding to a first state of said object and a second amplitude corresponding to a second state of said object;

switch means for providing multifunction programming of the sensor operational characteristics, said switch means generating a program signal;

processing means operatively connected to said emitting means, detecting means and switch means, for controlling one or more operational characteristics in response to said program signal;

said processing means having means for determining said first amplitude and said second amplitude at each of a plurality of gain levels of said variable gain amplifier, and comparing first and second amplitudes at each of said gain levels;

said processing means providing a gain adjust signal to adjust the gain of said variable gain amplifier to a gain level to maintain the greatest difference between the first and second amplitudes if the difference at each of said gain levels is less than a predetermined value;

said processing means providing a gain adjust signal to adjust the gain to the maximum gain level that maintains the difference between the first amplitude and the second amplitude greater than or equal to said predetermined value when the difference between the first amplitude and second amplitude is equal to a greater than said predetermined value at at least one of said gain levels;

said processing means further comprising means for establishing a sensor switching threshold based upon a comparison of said first amplitude with said second amplitude; and said processing further comprising means for establishing the sensor hysteresis value based upon a comparison of said first amplitude with said second amplitude.

10. A sensor comprising:

emitting means for emitting a detection signal such that the detection signal can be blocked by or reflected from an object;

detecting means for generating an electronic signal representing the presence, absence or condition of the object based upon the portion of the detection signal reed to the sensor;

a single switch means for providing multi-function programming of the sensor operational characteristics, said switch means generating a program signal;

processing means operatively coupled to the emitting means, detecting means, and switch means, for controlling one or more operational characteristics in response to said program signal;

said detecting means comprising a variable gain amplifier and said processing means comprising means for determining said first amplitude and said second amplitude at each of a plurality of gain levels of said variable gain amplifier, comparing the first and second amplitude at each of said gain levels, and providing a gain adjust signal, such that the gain can be adjusted to one of said plurality of gain levels.

* * * * *